United States Patent [19]
Fried

[11] Patent Number: 6,040,717
[45] Date of Patent: Mar. 21, 2000

[54] FRCPG: FORECASTED RESTORATION COMPLEMENTARY PASS GATES

[75] Inventor: Rafael Fried, Caesaria, Israel

[73] Assignee: I.C. Com Ltd., Azor, Israel

[21] Appl. No.: 08/901,834

[22] Filed: Jul. 28, 1997

[51] Int. Cl.[7] ............................................. H03K 19/094
[52] U.S. Cl. ........................ 326/113; 326/112; 326/121; 326/17
[58] Field of Search ................... 326/113, 119, 326/121, 47, 17, 112

[56] References Cited

U.S. PATENT DOCUMENTS

| | | | |
|---|---|---|---|
| 4,541,067 | 9/1985 | Whitaker | 364/716 |
| 4,559,609 | 12/1985 | Robinson, Jr. et al. | 364/784 |
| 4,620,117 | 10/1986 | Fang | 307/451 |
| 5,808,483 | 9/1998 | Sake | 326/113 |

*Primary Examiner*—Don Wong
*Assistant Examiner*—Shih-Chao Chen
*Attorney, Agent, or Firm*—Mark M. Friedman

[57] ABSTRACT

A static pass-transistor logic gate design which incorporates the new technique of forecasted-restoration of the output logic-level. The forecasting of the need for output logic-level restoration is accomplished by the connection of restoration circuit inputs to a logic-gate input, which provides the appropriate logic input signal to the restoration circuit, to properly control the state of the restoration circuit. Logic gate inputs which are unnecessary in the determine of the appropriate restoration circuit input logic state are connected to the appropriate input logic levels. Further, there is potential for significant area savings, with accompanying economic benefit when using the FRCPG logic, due to the reduced transistor count of FRCPG.

4 Claims, 6 Drawing Sheets a b

AND/NAND implementation in FRCPG
a: CPL like
b: EEPL like

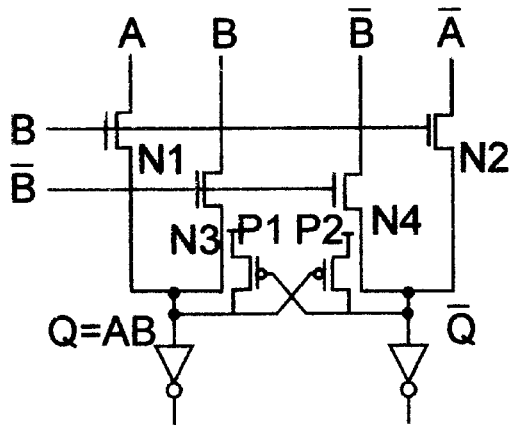
a
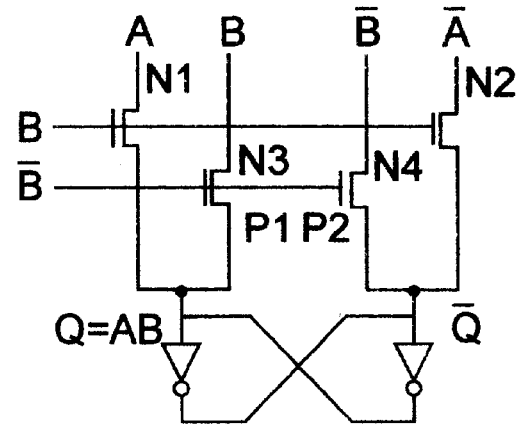
b
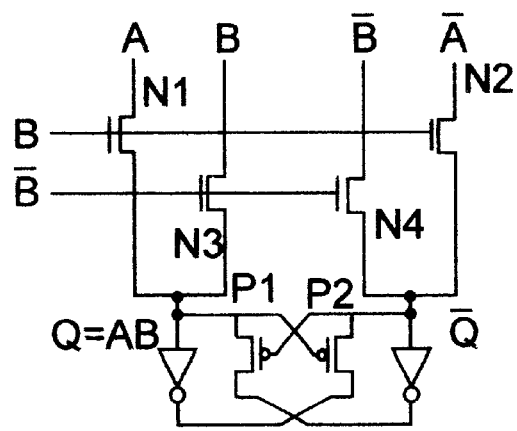
c
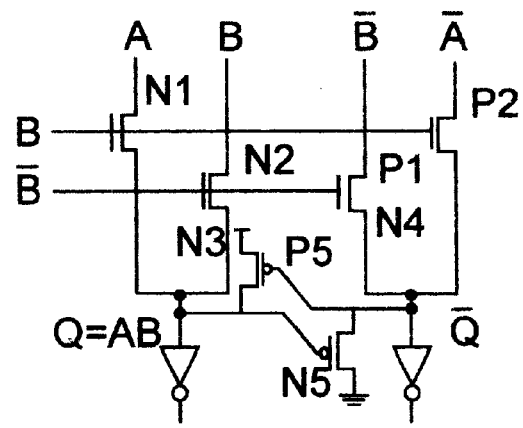
d
Fig. 1 PRIOR ART
AND/NAND implementation in
a. CPL
b. SRPL
C. EEPL
d. PPPL

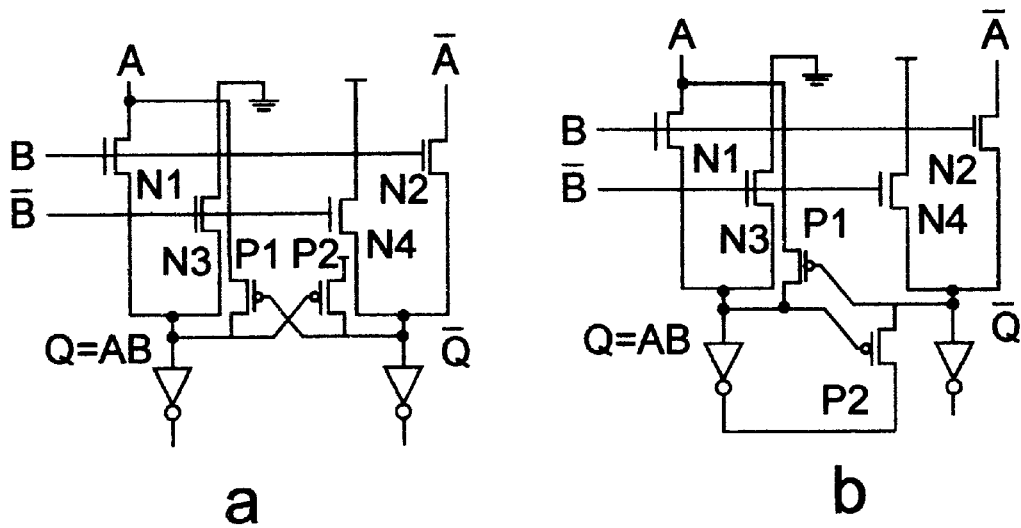
Fig. 2 AND/NAND implementation in FRCPG
a: CPL like
b: EEPL like
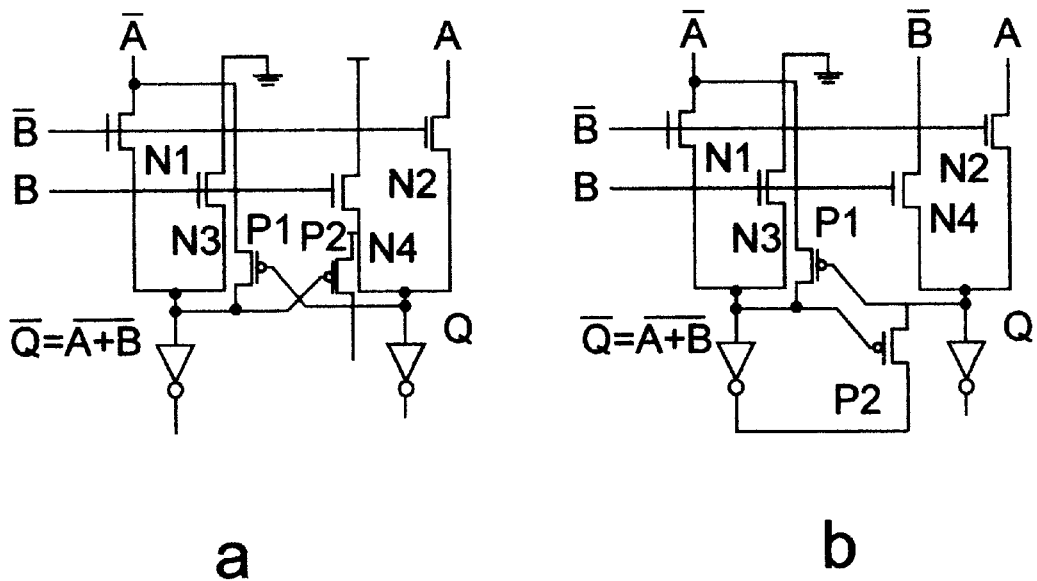
Fig. 3 OR/NOR implementation in FRCPG
a: CPL like
b: EEPL like

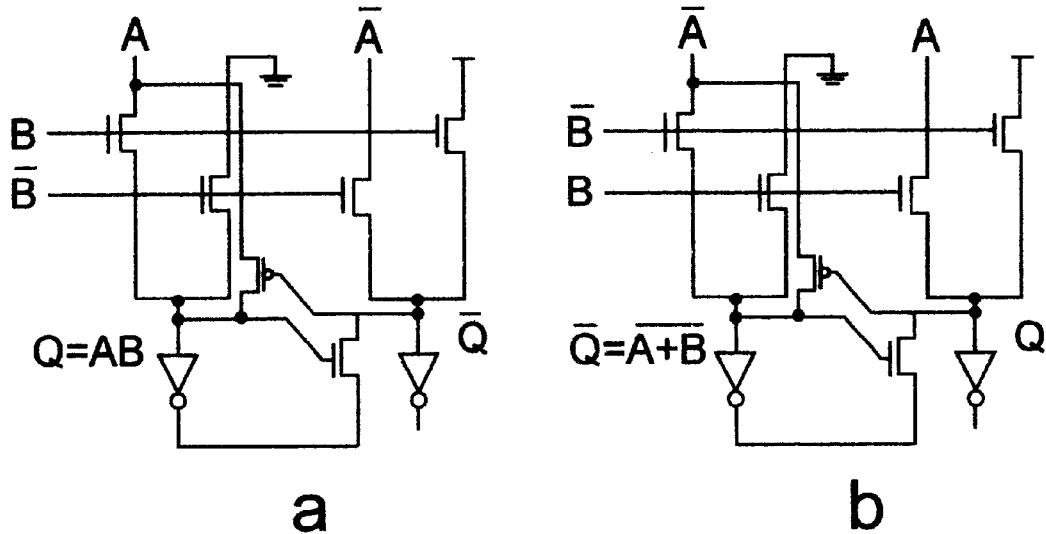
Fig. 4 PPPL-like implementation in FRCPG
a. AND/NAND
b. OR/NOR
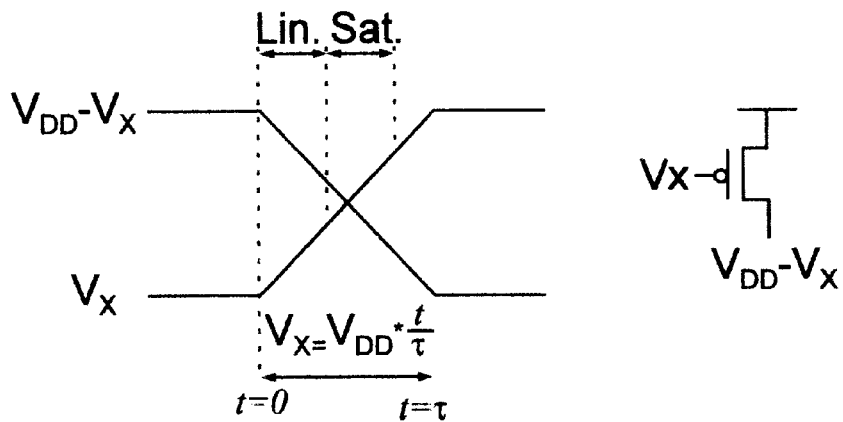
$$E_g = V_{DD} \cdot \left( \int_0^{\frac{2\tau}{5}} I_{LIN} d_t + \int_{\frac{2\tau}{5}}^{\frac{4\tau}{5}} I_{SAT} d_t \right) \cong \frac{V_{DD}^3 \cdot \beta \cdot \tau}{25}$$
Where $\beta = (W/L) \cdot \mu \cdot C_{ox}$
Fig. 5

FRCPG: FORECASTED RESTORATION COMPLEMENTARY PASS GATES

FIELD AND BACKGROUND OF THE INVENTION

The present invention relates to a static, pass-transistor, logic family and, more particularly, to a Forecasted-Restoration Complementary Pass-Gate (FRCPG) logic family. The advantages of the new FRCPG logic family are speed improvement and lower energy dissipation than in the prior art static pass transistor logic families.

General Description:

Pass-transistor logic, in the present discussion, consists of a type of metal/oxide-or-insulator/silicon-or-semiconductor (MOS) logic integrated in integrated circuits (IC's). MOS transistors are used as switches. An n-channel (NMOS or nmos) transistor is turned on by application of a positive input voltage, approximately equal to the positive supply voltage, to the nmos gate terminal, and is preferably turned off by connecting the nmos gate to a voltage approximately the value of the negative supply terminal voltage. A p-channel (PMOS or pmos) device is turned on by connecting the pmos gate to a voltage approximately the value of the negative supply, while the pmos is preferably turned off by connecting the pmos gate to a voltage approximately the value of the positive supply voltage.

The problem with pass-transistor logic is that the pass-transistors, which function in a sense, ideally, as series switches in a logic-signal, signal path, for the logic input which connects to a source/drain diffusion, also function as source followers with respect to the gate input of the pass-transistor. Thus, for a simple pass-transistor gate, an nmos drain will be one input terminal, the nmos gate will be a second input terminal, and the nmos source will be the output terminal. Now, if both the drain voltage is high and the gate voltage is high, then the output, source voltage will be high. High means approximately equal to the positive logic-level voltage, usually the positive supply voltage. But for each such AND gate which a logic signal is required to propagate, by way of a series of gate-input-connections, the logic gate output voltage will be one nmos-transistors gate-source threshold voltage lower than the nmos-gate-terminal logic gate input voltage. Similarly, a pmos AND gate would suffer from an upward level-shifting of the output voltage with respect to the pmos-gate terminal input voltage.

Thus, it is necessary after each pass-transistor logic gate, or after each so-many logic gates, to perform a logic-level "restoration". The need for restoration is due to the fact that the "weak logic state 1", a logical 1 having a dc level one threshold voltage below the positve rail, will cause DC voltage leakage if the weak logic state 1 output will then be used as an input to another, following, cmos gate, since the input PMOS of a cmos gate will then not be completely turned off. In addition if the weak logic state 1 will be used as a gate signal to another NMOS pass transistor, the NMOS pass transistor output will then be two threshold-voltage drops lower than the positive rail. This is the problem discussed in the previous paragraph with respect to AND gate use of the pass transistors. In complementary MOS (CMOS or cmos) logic, the output of the basic pass-transistor logic gate is connected to a cmos inverter input. The cmos inverter output swing is from supply-rail to supply-rail. Therefore, the logic level of the inverter output logic signal has been restored to the ideal logic-level values. The restoration is due to the PMOS latch before the output inverter that is used only as a buffer. This latch is not always used in CPL, which is discussed below. The "original" CPL, to be discussed below does not have this PMOS latch and hence suffers from leakage at the inverter, due to the reason mentioned in reference 4. The inversion due to the cmos inverter must be taken into account in the system logic design. The easiest way to accommodate the additional logic-signal logical inversion due to the added inverter, is to include the inverter in the unit pass-gate design, with the resulting pass-transistor logic gate then including both the correct logic function terminal definition, and including logic level restoration. The FRCPG logic family of the present invention incorporates these features.

The new, inventive, "forecasting" feature of the present invention of the need for signal-level restoration in the logic gate, is based on Applicant's realization that the need for output signal logic-level restoration in AND/NAND an OR/NOR gates can be predicted according to a single logic-gate input.

Prior Art & Problems:

Static pass-transistor logic families are used extensively in large custom arrays, such as multipliers and adders. The two main reasons for using static pass-transistor logic is the higher logic-gate functionality per transistor count in a given delay time, and the lower overall capacitance than obtained with conventional logic families, such as CMOS logic, for example. This typically results in lower power consumption and higher operation speed, yielding a lower power-delay product, which usually gives an indication about the lower circuit energy dissipation.

There are several different approaches to implement static pass logic gates. These can be divided into two main categories. In the first category, only one pass-transistor type is used, usually n-channel, combined with output signal restoration, in order to achieve full rail-to-rail swing. In the second category, both n-channel and p-channel pass transistors are used, and signal restoration is not needed, for example, double-pass logic (DPL), or conventional full-CMOS transmission gates, which employ parallel p-channel and n-channel switches. In general, the second category uses more transistors, and thus presents higher input capacitance, but at the same time provides shorter delay times in some applications.

Energy consumption is especially important in battery-operated systems, as battery life is defined in terms of energy, rather than simply power. For a given architecture, ic manufacturing process, supply voltage, and operating frequency, the energy waste is mainly due to the circuit's parasitic capacitance and the feed-through (short-circuit) currents.

When using pass logic families, the overall capacitance is usually reduced compared with conventional CMOS implementations.

The present invention presents a way to reduce the feed through currents in static pass logic families with signal restoration. This is accomplished by using output signal restoration only when the restoration is needed, and to eliminate the restoration when the restoration conflicts the inputs—i.e., results in a logic state in which both the logic input pass transistor and the restoration-logic transistor are conducting simultaneously, resulting in increased current drain from the power supply, and, hence, increased power dissipation. The implementation is based on the fact that in both the AND and NOR gates, it is sufficient to observe only one input in order to predict the chances of the output being high. By using this conditional restoration method, the overall energy consumption is reduced.

Prior-art pass logic families with output restoration are shown in FIGS. 1A–1D. These prior art logic families are (A) complementary pass logic (CPL), (B) swing restoration pass logic (SRPL), (C) energy economized pass logic (EEPL), and (D) push pull pass logic (PPPL).

Comparison of the different pass logic families follows.

Both the CPL, FIG. 1A, and PPPL, FIG. 1D, gates can operate properly also without the buffering inverters at the output. In some circuit applications, CPL and PPPL may be used without output level performance degradation, but the number of series connected pass transistors is still limited by the distributed R-C. This has the effect of energy reduction, since overall less capacitance must be charged and discharged. SRPL, FIG. 1B, and EEPL, FIG. 1C, on the other hand, must employ buffers as part of their restoration scheme.

The PPPL drive capability, without output buffers, can be better than the drive capability of CPL. but only WHEN Q=1, where the n-channel, N5, FIG. 1D, restoration transistor is on. The fact that PPPL uses p-channel pass transistors increases the logic gate input capacitance, due to the larger size needed for the p-channel devices than for the n-channel devices. In addition, since both p-channel and n-channel restoration transistors are used, the feed-through current is larger when point Q is changed from "1" to "0", since both restoration transistors, N5 and P5, are on at the beginning of the phase. When observing both points Q and Q', where Q' indicates "Q-bar", PPPL has six logic states with conflict currents between input and restoration. (AB= 00, 01, 10, both for Q and Q'), while CPL has only four logic states with conflict currents between input and restoration. (AB=00, 01, 10, for Q; and AB=11 for Q').

SRPL, FIG. 1B, requires using larger n-channel pass transistors, implying larger logic-gate input capacitance compared with CPL, in order to turn over the latch at the SRPL logic-gate output. This problem becomes worse when many gates are cascaded, and the SRPL can even fail to switch to ground.

For both SRPL and EEPL, there is always a conflict between the restoration current and the inputs when the outputs are changed, since restoration is done from the complementary output.

In EEPL, restoration is done only after a delay introduced by the output inverters, which makes EEPL slower than CPL, but EEPL has the advantage of reduced peak power consumption. However, the average power consumption of EEPL is practically the same as the average power consumption of CPL.

In general, the restoration scheme introduces a power waste, combined with an increase in the delay time, due to the feed-through current flowing from the restoration transistor to the input pass transistor. This problem is addressed in the novel forecast-restoration circuits of the present invention.

The static pass-transistor logic families of the circuits of FIGS. 1A–1D represent the attempts to optimize speed and power consumption in the face of the need for output signal-level restoration. Each of the prior art circuits has disadvantages, as discussed above.

There is thus a widely recognized need for, and it would be highly advantageous to have, an output signal-level restoration scheme that provides improved speed with lower power consumption, while providing the required output signal-level restoration.

SUMMARY OF THE INVENTION

According to the present invention there is provided an improved static pass-transistor logic family, having improved speed and lower energy consumption.

According to further features in preferred embodiments of the invention described below, the novel static pass-transistor logic family incorporates a new type of output signal-level restoration, the new inventive forecasted-restoration output signal-level restoration technique.

According to still further features in the described preferred embodiments, the output-signal signal-level forecasting technique is applied to various prior-art static pass-transistor logic families with output signal-level restoration.

The present invention successfully addresses the shortcomings of the presently known configurations by providing output signal-level restoration based on a forecasting method, based on the Applicant's recognition that the need for output signal-level restoration may be predicted from a single input in AND/NAND and OR/NOR gates.

How to Use

The FRCPG logic family of the present invention involves two circuit changes to the prior art static pass-transistor logic of the prior art.

First, logic-gate inputs and restoration-circuit inputs which do not require connection to input drive signals, are connected to the appropriate supply line input logic level. This represents a savings of energy in the system, since energy is not consumed in the charging of these re-connected logic-gate-input mos transistor gate capacitances.

Second, remaining restoration circuit inputs which are previously connected to the Q or Q' points, are re-connected to the appropriate logic-gate input terminals, the logic-gate input signal then doing the "forecasting" of the output-level restoration.

Thus, a static pass-transistor logic gate according to the present invention comprises (a) pass-transistor logic circuitry, said pass-transistor logic circuitry including logic inputs, said logic inputs for receiving complementary logic input signals;

(b) an output logic-level restoration circuit, said restoration circuit including restoration-circuit inputs;

(c) each logic input which is not needed in determining the need for output logic-level restoration connected to the appropriate input logic level; and, (d) a restoration circuit input connected to the appropriate logic-gate input to accomplish the forecasting of the need for output logic-level restoration.

A method, according to the present invention, for the design of a forecasted restoration static pass-transistor logic gate (FRCPG) based on a prior art static pass-transistor logic gate having output signal restoration comprises (a) analyzing the prior art logic gate to identify logic states having conflict current between logic inputs and restoration circuit inputs;

(b) analyzing the prior art logic gate to identify logic states based in which the need for output signal level restoration may be determined;

(c) selecting a logic circuit input from the group consisting of inputs due to logic states identified in step (b), said selected input having the fewest possible said conflict states identified in step (a);

(d) connecting said selected input from step (c) to an appropriate logic gate input selected from the group of logic gate inputs corresponding to the fewest said conflict current states; and, (e) connecting logic-gate inputs, the states of which do not determine need for output restoration, to the appropriate logic levels.

Additionally, a FRCPG gate according to the present invention may further comprise output buffers.

The practical implementation of the inventive restoration forecasting technique will be discussed below with respect to the drawing figures.

BRIEF DESCRIPTION OF THE DRAWINGS

The invention is herein described, by way of example only, with reference to the accompanying drawings, wherein:

FIGS. 1A–1D show prior-art pass logic families without output restoration;.

FIGS. 2A–2B illustrate CPL-like and EEPL-like FRCPG AND/NAND implementations, respectively;

FIGS. 3A–3B illustrates CPL-like and EEPL-like FRCPG OR/NOR implementations, respectively;

FIGS. 4A–4B illustrate PPPL-like FRCPG AND/NAND and OR/NOR implementations, respectively;

FIG. 5 illustrates restoration voltages waveforms;

DESCRIPTION OF THE PREFERRED EMBODIMENTS

Figure 6:
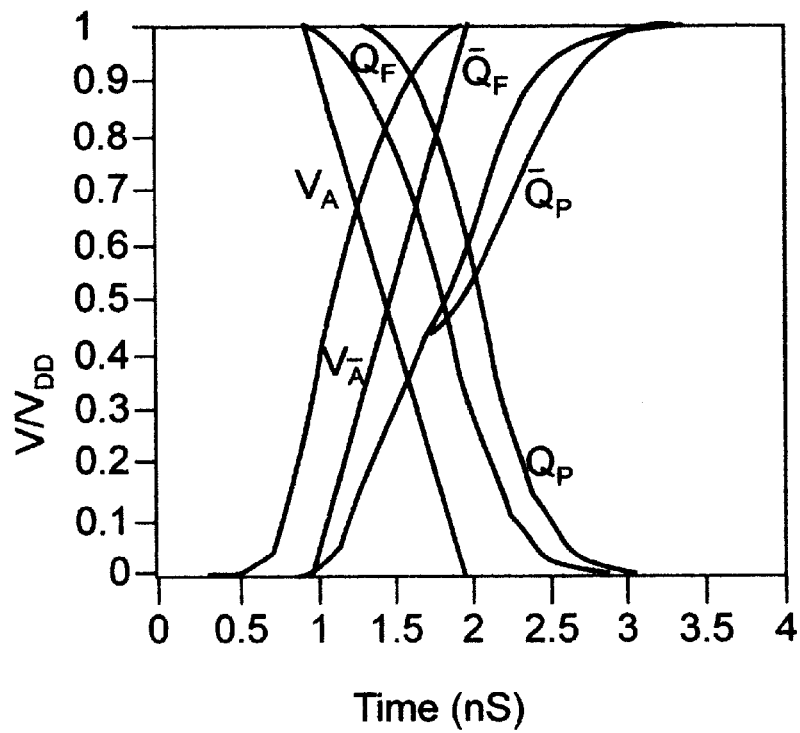
FIG. 6 is a plot of delay times of CPL and FRCPG.

The present invention is of a static pass-transistor logic family design technique which can be applied to the various prior art static pass-transistor logic families. Specifically, the present invention can be used to improve speed and reduce power consumption of static pass-transistor logic families. The method involves forecasting of the need for output signal-level restoration. The method includes reconnecting selected logic-gate inputs to the appropriate logic levels, and reconnecting restoration logic circuit inputs from the Q or Q' logic points to the appropriate logic-gate input terminals, to accomplish the required forecasting.

The principles and operation of a FRCPG, forecast-restoration complementary pass-gates logic family according to the present invention may be better understood with reference to the drawings and the accompanying description.

Referring now to the drawings, FIGS. 1A–1D illustrates the prior art pass-transistor logic families to be improved upon. These figures, which were discussed above will serve as reference drawings for comparison of the corresponding new FRCPG logic gates.

FIGS. 2A–2B illustrate CPL-like and EEPL-like FRCPG AND/NAND implementations, respectively.

The first energy conserving change, suitable for the FRCPG implementations of all the logic families illustrated in FIGS. 1A–1D, except SRPL (FIG. 1B), is the connection of the B and B' logic-gate inputs to VSS and VDD, respectively, instead of driving the driving the B and B' logic-gate inputs with the B and B' logic input signals. This change is suitable also if the FRCPG is not used, and the current logic families are used as is without forecasted restoration.

The second change concerns the restoration circuitry. Since Q=1 only for A=B=1, the source of the restoration transistor P1 may be connected to either he A or B input, for example, to input A, as in FIGS. 2A–2B. The main advantage of this configuration is the elimination of the feed-through current through P1, when B=1, and A is changed from "1" to "0". This re-connection of P1 source to logic-gate input A has both the effects of reducing energy consumption and delay time. Moreover, the re-connection of P1 source to input A provides node Q with an additional discharge path.

The same improvements may be applied to the OR/NOR gate, as shown in FIGS. 3A–3B. Since the NOR-gate output rises to "1" only when A=B=0, the source of restoration transistor P1 may be connected to either the A' or B' logic-gate input.

As may be seen in both FIGS. 2A–2B and 3A–3B, N4 is always connected to VDD in all the FRCPG implementations. Hence, for speed improvement, restoration transistor N4 may alternatively be replaced by a p-channel transistor having the gate of the p-channel transistor connected to the opposite-polarity input, i.e., to the A' logic-gate input. In this way, the charging of node Q, when logic-gate input B changes from state, either from "1" to "0" in the NAND logic-gate, or from "0" to "1" in the OR logic-gate, may be speeded up. However, energy consumption will be increased by the use of this substitution of a p-channel restoration for N4, due to the larger gate capacitance of the p-channel device than the gate capacitance of n-channel device N4.

A full FRCPG gate may be constructed based on the prior-art PPPL logic family. FIGS. 4A–4B illustrate PPPL-like FRCPG AND/NAND and OR/NOR implementations, respectively. Here, restoration prediction is added to the OR and NAND gates. Similarly to the prediction of restoration to VDD for the AND and NOR gates, restoration to VSS is predicted for the OR and NAND gates. The prediction is based on the fact that the OR and NAND gate outputs are low in only one logic state, when A=B=1 for the NAND gate; and when A=B=0 for the OR gate. Therefore, restoration can be predicted by the state of either the A input or of the B input for the OR gate; and restoration can be predicted by the state of either the A' or B' input for the NAND gate.

The FRCPG PPPL-like implementations exhibit dual paths for both outputs. In this sense, the PPPL-like FRCPG performance is similar to that of conventional full CMOS transmission gates, since in DPL both input signals are used as control and pass simultaneously. The PPPL-like FRCPG implementation uses only six transistors, compared to the eight transistors required in both DPL and in the conventional full CMOS transmission gate implementation. Therefore, the PPPL-like FRCPG implementation has lower input capacitance than the corresponding prior art logic families.

Due to the fact that only six transistors are used in the FRCPG logic gates of the present invention, compared with eight transistors in either DPL and CMOS transmission gates, there is an area reduction due to the use of the present invention. This area reduction is clearly a very serious economic benefit, since die cost is related exponentially to die size (area), as is well known to practitioners of the IC design art, and for gate-intensive systems, there is potential here for significant area savings.

Of the four logic states in a two-input logic gate, PPPL-like FRCPG has only one logic state with conflict feedthrough current for both the complementary outputs.

The conflicting feedthrough-current states are AB=10 in the AND/NAND gate; and AB=01 in the OR/NOR gate. The remaining three logic states in each type gate have a dual path.

In contrast, the CPL-like FRCPG gates reduce the number of conflict states from three to one, for only one of the complementary outputs. However, since there were initially only four conflict states for both Q and Q', the overall result is the same for PPPL-like and CPL-like FRCPG. The only conflict states in the CPL-like FRCPG AND/NAND are AB=10 for Q; and AB=11 for Q'. In the CPL-like FRCPG OR/NOR, the only two conflict logic states are AB=00 for Q; and AB=01 for Q'.

In general, for all the FRCPG implementations illustrated here, there is a direct energy gain in only one cycle. For example, in the AND/NAND implementation, there is a current gain due to the feedthrough current elimination, only when B=1. On the other hand, there is energy loss due to the additional input capacitance introduced by the connection of the source of the restoration transistor to the input.

Assuming linear transitions for Q and Q', as shown in FIG. 5, and assuming $V_{TH}$=VDD/5, where $V_{TH}$ is the threshold voltage of the restoration transistor, and using a simplified current model for the MOST, the energy gain can be written as Equation (1), given in FIG. 5, where beta= (W/L) u $c_{ox}$, and $I_{LIN}$ and $I_{SAT}$ are the restoration currents when the restoration transistor operates in the linear and saturated regions, respectively. $E_g$ is actually the energy waste due to the restoration feedthrough current, without using the FRCPG technique. When using FRCPG, this energy is saved.

The energy loss due to FRCPG is given by, $$E_t = C V_{DD}^2, \quad (2)$$

where C is the additional input capacitance due to re-connection of restoration circuit inputs, from Q or Q', to the logic-gate signal inputs, A or A' or B or B'.

Assuming equal probability of B=1 or B=0, the condition for overall energy gain, i.e., reduced energy consumption of a given FRCPG logic gate versus the energy consumption of the corresponding prior-art logic gate, is given by, $$E_g > 2 E_t. \quad (3)$$

$E_t$ is multiplied by a factor of 2, since the additional input capacitance is switched both when B=0 and when B=1. By substituting equations (1) and (2) into equation (3), the condition for overall energy reduction, in terms of the circuit parameters, is given by, $$C < V_{DD} \text{ beta tau}/50,. \quad (4)$$

where tau is the rise and fall times of the Q and Q' nodes, as illustrated in FIG. 5.

From equation (4), we see that the energy gain is greater for high supply voltage, slow output slopes, and strong (large W/L) restoration transistors. The last two parameters may also be related to large output capacitance. Substituting typical values in equation (4), $V_{DD}$=5V, beta=2.5 E-4 A/V, and tau=1.5 E-9seconds, yields the required condition for energy gain (reduced energy loss) of C<40 mpF=40 E-15 F. This capacitance value is typically two to four times larger than the parasitic source capacitance of the restoration transistor.

Performance Comparisons:

Delay time and power consumption simulation comparisons of FRCPG versus CPL, and of FRCPG versus PPPL, will be given.

A. CPL-like FRCPG versus CPL:

The FRCPG AND/NAND of FIG. 2A was compared with the CPL gate of FIG. 1A. In both cases, output buffers were not used, and the B and B' pass inputs in FIG. 1A were connected to $V_{SS}$ and $V_{DD}$, respectively. Identical transistor sizes and load capacitances were used for both implementations. The FRCPG configuration shown in FIG. 2A presents a performance improvement only in the cycle when B=1 and input A changes state.

Figure 7:
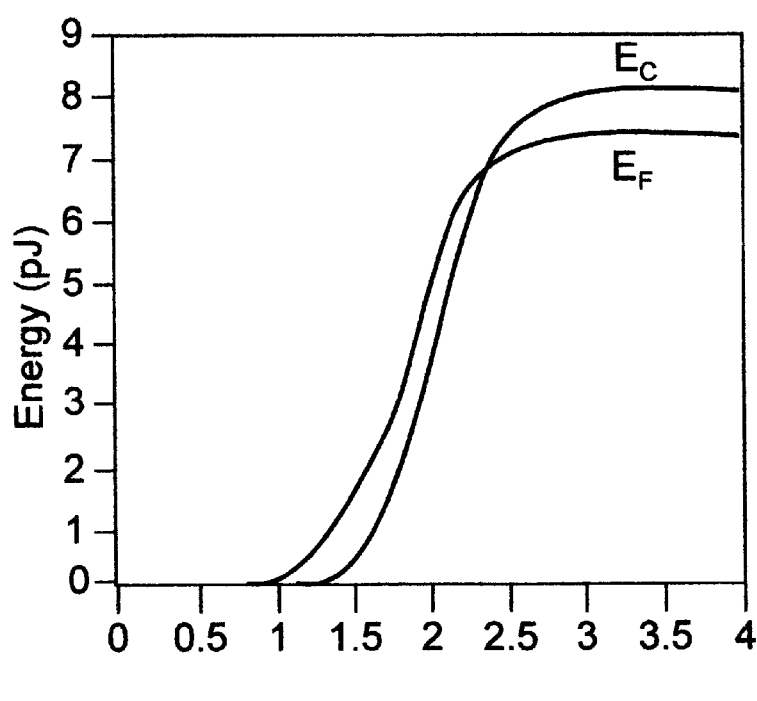
FIG. 7 is a plot of energy consumption of CPL and FRCPG.

FIG. 6 depicts the input and output voltages for both implementations in this cycle, QC and QC' are the outputs of the CPL gate, and QF and QF' are the outputs of the FRCPG gate. FIG. 7 presents the total energy consumption. EF is the energy dissipated by the FRCPG and EC is the energy dissipated by the CPL. The energy includes both the energy consumed from the input sources and the energy consumed from the power supply, calculated according to, $$E = V_{DD} f (I_{VA} + I_{VDD}) dt, \quad (5)$$

where f indicates the mathematical integration operation, $I_{VA}$ is the current flowing from the input source driving input A. The energy saving of the FRCPG compared with the modified CPL is ten percent and the delay time is thirty percent shorter.

Figure 8:
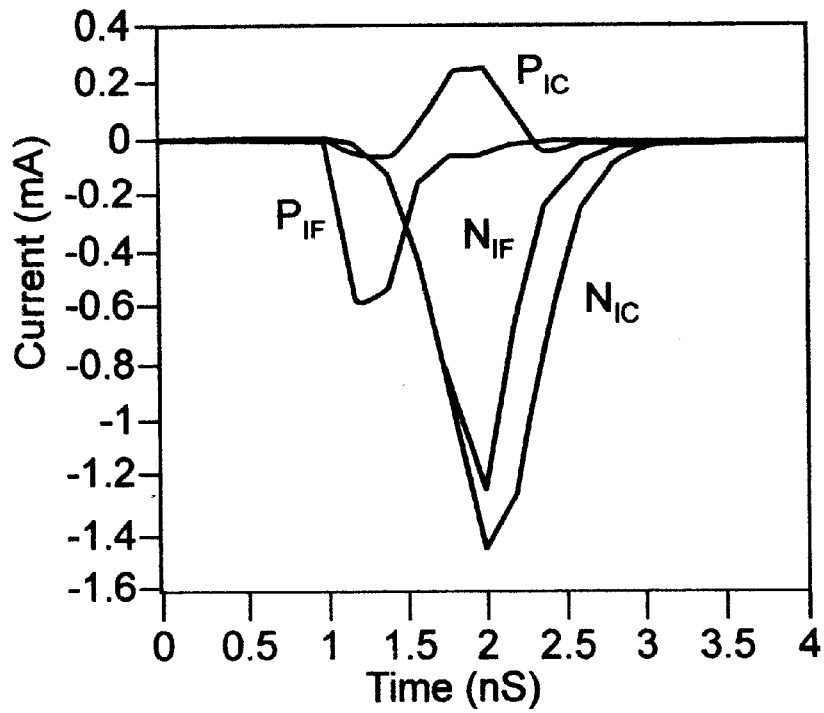
FIG. 8 is a plot of restoration current in CPL and FRCPG.

FIG. 8 depicts the current flowing through restoration transistor P1 and the input transistor N1 for both implementations. P1F and N1F are the transistors in the FRCPG and P1C and N1C are the transistors in the CPL. As can be seen in FIG. 8, in the CPL most of the restoration current is a feed-through current that conflicts the input current, while in the FRCPG the restoration current flows in the same direction as th input current.

Figure 9:
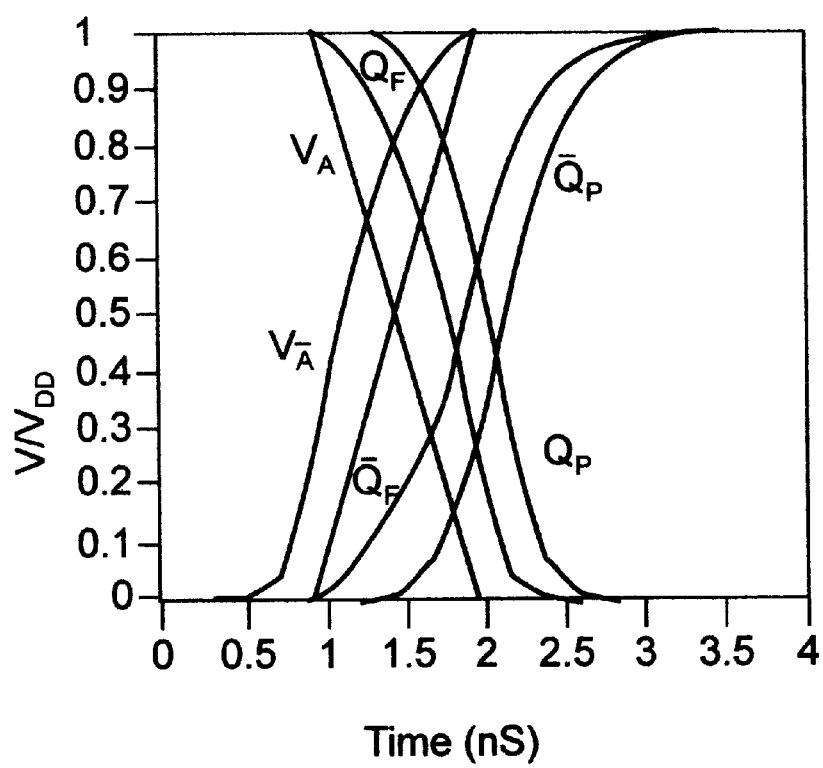
FIG. 9 is a plot of delay times of PPPL and FRCPG.
Figure 10:
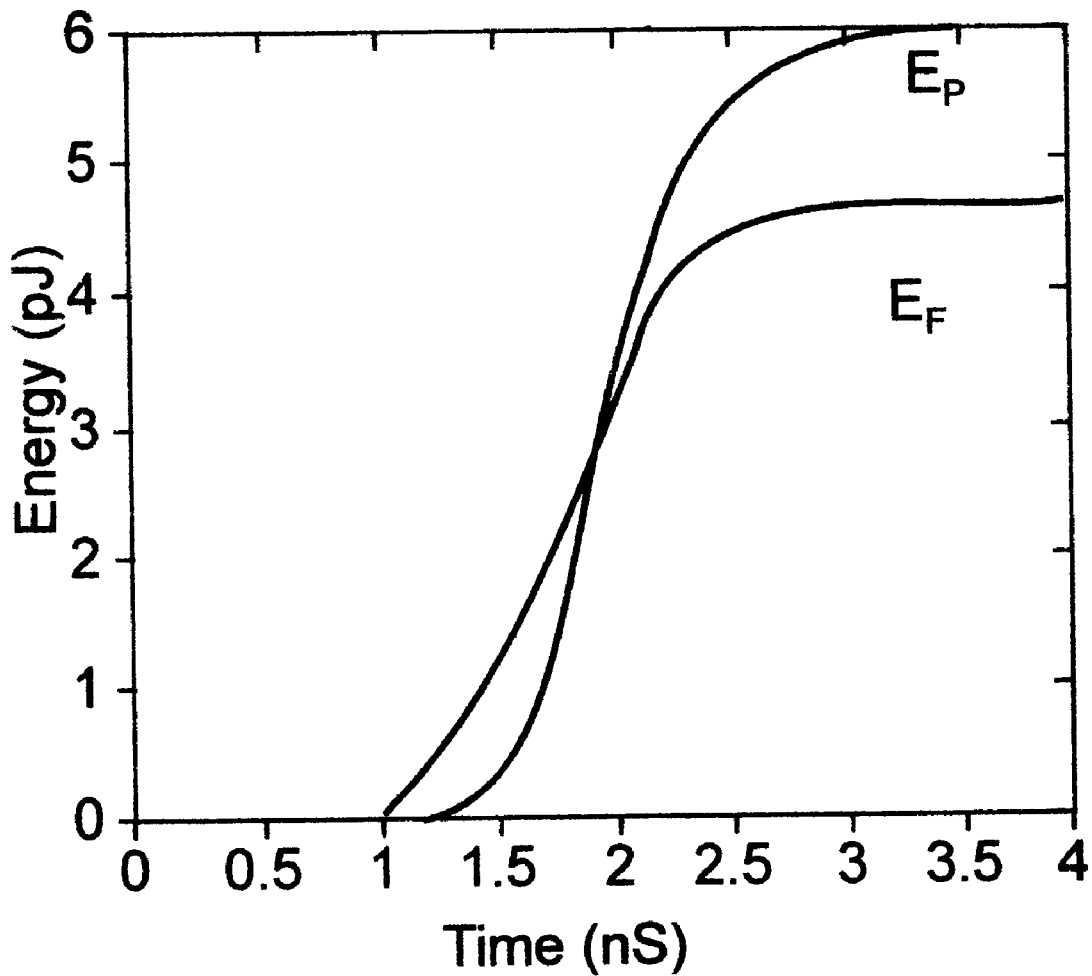
FIG. 10 is a plot of energy consumption of PPPL and FRCPG.

A. PPPL-like FRCPG versus PPPL:

A similar comparison may also be performed between the PPPL AND/NAND in FIG. 1D and the FRCPG PPPL-like AND/NAND in FIG. 4A. As in the previous comparison, identical transistor sizes and load capacitances were used for both implementations. In both cases, B and B' pass inputs were connected to $V_{SS}$ and $V_{DD}$, respectively. The input and output voltages for both implementations are depicted in FIG. 9, where QF and QF' are the outputs from the FRCPG and QP and QP' are the outputs from the PPPL. FIG. 10 presents the energy consumption. EF is the energy consumption of the FRCPG and EP gives the energy consumption of the PPPL.

In this case, the gain by using FRCPG, both in terms of delay time and energy consumption, is greater than in the previous case. The reason is, on the one hand, the dual path from input to output on both Q and Q', and on the other hand, the elimination of the conflict feed-through current between the inputs and the restoration transistors, for both Q and Q'. The PPPL-like FRCPG consumes twenty-five percent less energy than the PPPL gate, and the PPPL-like FRCPG delay time is forty percent shorter than the PPPL delay time.

Conclusion:

FRCPG is applicable to AND/NAND and OR/NOR gates. FRCPG introduces two advantages over the other static pass-transistor logic families having output signal restoration. The first advantage is the reduction of the number of logic states with conflict feed-through current flow between the restoration and input signals. The second advantage is the dual path provided to the output from both the input transistor and the restoration transistor.

When using FRCPG, the power consumption and delay time are not reduced for all the possible logic states of the logic gate, however, the effect is an overall energy saving.

The total energy gain (energy consumption reduction) depends on the application. When the outputs have large activity factors, making many transitions per unit time, the relative energy saving is greater.

Combining the energy saving with the fact that FRCPG may also be used without output buffering stages, FRCPG may be used to implement very low energy consuming static logic blocks.

While the invention has been described with respect to a limited number of embodiments, it will be appreciated that many variations, modifications and other applications of the invention may be made.

References:

[1] Yano, K., et al., "A 3.8 nS CMOS 16×16-b Multiplier Using Complementary Pass-Transistor Logic", IEEE JSSC, Vol. 25, No. 2, pp. 388–395, April '90.

[2] Parameswar, A, H. Hara, and T. Sakurai, "A High-Speed, Low-Power, Swing-Restored Pass-Transistor Logic Based Multiply and Accumulate Circuit for Multimedia Applications", CICC, pp. 278–281, '94.

[3] Song, M., et al., "Design Methodology for High Speed and Low Power Digital Circuits with Energy Economized Pass Transistor Logic", ESSCIRC, pp. 120–123, '96.

[4] Paik, W., H. Ki, and S. Kim, "Push-Pull Pass-Transistor Logic Family for Low Voltage and Low Power", ESSCIRC, pp. 116–119, '96.

[5] Suzuki, M., et al., "A 1.5 nS CMOS ALU in Double Pass-Transistor Logic", IEEE JSSC, Vol. 28, No. 11, pp. 1145–1151, November '93.

[6] Chung-Yu, W., L. Jr-Houng, and C. Kuo-Hsing, "A New CMOS Current Sensing Complementary Pass-Transistor Logic (CSCPTL) for Low-Voltage High-Speed Applications", ISCAS, pp. 25–28, '95.

[7] Kuo-Hsing, C., and Y. Liow, "A 1.2V CMOS Multiplier Using Low-Power Current-Sensing Complementary Pass Logic", ICECS, pp. 1037–1040, '96.

What is claimed is:

1. A static pass-transistor logic gate comprising
   (a) pass-transistor logic circuitry, said pass-transistor logic circuitry including logic inputs, said logic inputs for receiving complementary logic input signals;
   (b) an output logic-level restoration circuit, said restoration circuit including restoration-circuit inputs;
   (c) each logic input which is not needed in determining the need for output logic-level restoration connected to the appropriate input logic level; and,
   (d) a restoration circuit input connected to the appropriate logic-gate input to accomplish forecasting of the need for output logic-level restoration.

2. A method for the design of a forecasted restoration static pass-transistor logic gate (FRCPG) based on a prior art static pass-transistor logic gate having output signal restoration comprising
   (a) analyzing the prior art logic gate to identify logic states having conflict current between logic inputs and restoration circuit inputs;
   (b) analyzing the prior art logic gate to identify logic states based on which the need for output signal level restoration may be determined;
   (c) selecting a restoration circuit input from the group consisting of inputs due to logic states identified in step (b), said selected input having the fewest possible said conflict states identified in step (a);
   (d) connecting said selected input from step (c) to an appropriate logic gate input selected from the group of logic gate inputs corresponding to the fewest said conflict current states; and,
   (e) connecting logic-gate inputs, the states of which do not determine need for output restoration, to the appropriate logic levels.

3. A reduced-energy-consumption static pass-transistor logic gate comprising
   (a) pass-transistor logic circuitry, said pass-transistor logic circuitry including logic inputs, said logic inputs for receiving complementary logic input signals; and,
   (b) each logic input, which would not be needed in determining the need for output logic-level restoration, if output logic-level restoration were present, connected to the appropriate input logic level.

4. A method for the design of a reduced-energy-consumption static pass-transistor logic gate based on a prior art static pass-transistor logic gate having output signal restoration comprising
   (a) analyzing the prior art logic gate to identify logic inputs which would not be needed in determining the need for output logic-level restoration, if output logic-level restoration were present;
   (b) connecting said identified logic inputs, the states of which do not determine need for output restoration, to the appropriate logic levels.

* * * * *